United States Patent [19]

Endo et al.

[11] Patent Number: 4,910,123

[45] Date of Patent: Mar. 20, 1990

[54] PATTERN FORMING METHOD

[75] Inventors: Masayuki Endo, Izumi; Masaru Sasago; Kazufumi Ogawa, both of Hirakata, all of Japan

[73] Assignee: Matsushita Electric Industrial Co., Ltd., Osaka, Japan

[21] Appl. No.: 137,711

[22] Filed: Dec. 24, 1987

[30] Foreign Application Priority Data

Dec. 25, 1986 [JP] Japan .................. 61-311356
Dec. 26, 1986 [JP] Japan .................. 61-312039

[51] Int. Cl.$^4$ .................................................. G03C 5/16
[52] U.S. Cl. ........................ 430/326; 430/190; 430/193; 430/945
[58] Field of Search ............. 430/171, 190, 192, 193, 430/326, 945

[56] References Cited

U.S. PATENT DOCUMENTS 4,522,911  6/1985  Clecak et al. .................. 430/192
4,529,682  7/1985  Toukhy .......................... 430/190
4,626,491  12/1986  Gray ............................. 430/190

Primary Examiner—Jose G. Dees
Attorney, Agent, or Firm—Wenderoth, Lind & Ponack

[57] ABSTRACT

Disclosed is a pattern forming method using pattern forming material which is reactive to a light of 249 nm or so such as DUV light or excimer laser light and applicable to manufacture of semiconductors. The material used in this method includes resin which includes a bonding unit of

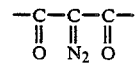

and has low absorption near 249 nm after light exposure, and is soluble in a solvent which dissolves the resin. By this method, a fine pattern of high contrast can be obtained.

11 Claims, 9 Drawing Sheets

PATTERN FORMING METHOD

BACKGROUND OF THE INVENTION

This invention relates to a pattern forming method, and more particularly to a method of forming patterns by using an exposure energy source such as a KrF excimer laser and far or deep ultraviolet rays in a resist material.

When using an excimer laser (ArF: 193 nm, KrF: 249 nm, XeCl: 308 nm, etc.) or far ultraviolet ray (around 190 to 330 nm) as the exposure source, as the material for resist [Deep Ultra-Violet (DUV) resist], AZ2400 (manufactured by Shipley Co.) and PMMA (polymethylmethacrylate) are proposed as the positive type or PGMA (polyglycidyl methacrylate) and CMS (Chloromethylated styrene; by Toyo Soda) as the negative type, among others. PMMA and PGMA are poor in resistance to dry etching and are very inferior in sensitivity. AZ2400 (which is about 10 times as high as PMMA but requires about 1000 to 2000 mJ/cm² (at a film thickness of about 0.5 μm) by KrF laser of 249 nm) is resistant to etching (because of novolak resin) and has the highest sensitivity among the commericially developed DUV resists [about 100 mJ/cm² (at a film thickness of about 1.0 μm) by KrF laser of 249 nm], but it is small in the difference in transmission before and after exposure when exposed to DUV light, which shows that the components in the resist that absorb the DUV light are contained initially in a considerable amount.

FIG. 8 shows an ultraviolet spectral curve of exposure with 249 nm laser. Accordingly, when a pattern is formed by DUV light using AZ2400, the light is absorbed in the resist, so that a resist pattern with favorable contrast is not formed (For example, H. Ito et al., Sympo. on VLSI Tech., 1982; K. J. Orvek et al., SPIE, 1986; V. Pol et al., SPIE, 1986).

Referring now to FIG. 9, a resist pattern forming method using the conventional AZ2400 is described below. On a substrate 1, AZ2400 is applied by rotation, and a resist film 3 of 1.5 μm in thickness is obtained (FIG. 9A). By KrF excimer laser light 4 of 249 nm, the resist film 3 is selectively exposed to DUV light 4 by using a mask 5 (FIG. 9B). Finally, by an ordinary alkaline development processing, a resist pattern 3a is obtained (FIG. 9C).

In this conventional AZ2400, however, since the light does not reach as far as the lower surface, the shape of the resist pattern 3a is deteriorated. Thus, in the conventional resist film obtained by using AZ2400 having a large surface absorption of light, it is impossible to obtain a fine pattern shape when a light source of short wavelength such as KrF excimer laser of 249 nm is used for exposure.

One of methods which is capable of solving these problems is shown in commonly assigned U.S. application Ser. No. 81,698 (filed; Aug. 3, 1987). This invention provides a similar but different method to solve these problems.

SUMMARY OF THE INVENTION

It is hence a primary object of this invention to prevent occurrence of deterioration of resolution and contrast of resist pattern conventionally experienced in the existing resist due to absorption of light (especially the excimer laser light of 249 nm) on the resist surface.

This invention provides a method of forming pattern by using a pattern forming material which is resistant to etching and is excellent in sensitivity resolution and contrast in the excimer laser exposure in the vicinity of 249 nm.

This invention also provides a pattern forming method by use of pattern forming material including resin which includes coupling unit of

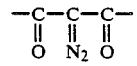

and has low absorption at around 249 nm after DUV exposure, and a solvent which dissolves the resin.

Further, this invention uses pattern forming material wherein a light sensitive material of

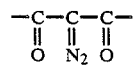

is included in the resin. Such material is obtained by making a cross-linked resin of

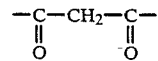

diazo after which a resin has low absorption at around 249 nm as polymer reacts to form the compound of

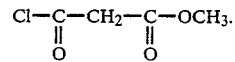

The compound having

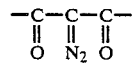

has a large absorption at near 249 nm before exposure with far ultraviolet rays or excimers (nonexposed state), and by such absorption at near 249 nm, becomes soluble in alkaline aqueous solution due to photoreaction, whereby it may be almost completely removed.

That is, the following reaction is caused by the far ultraviolet rays or excimer laser light, and the transmission rate after exposure is elevated, so that the reagent may be dissolved in alkaline aqueous solution.

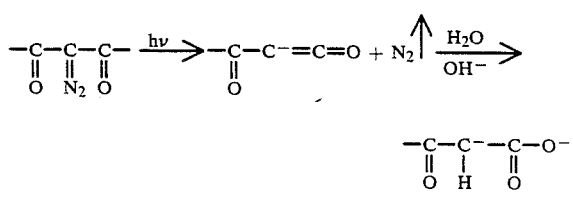

Further, after exposure, the chain

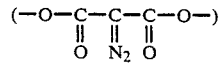

of the polymer coupled with

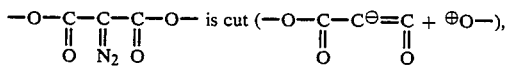 is cut ($-O-\underset{\underset{O}{\|}}{C}-\overset{\ominus}{C}=\underset{\underset{O}{\|}}{C} + {}^\oplus O-$), and then, the molecular weight is descreased so that solubility in alkaline solution is improved, sensitivity is improved, and contrast is improved since difference in solution speeds in the exposed area and in the non-exposed area is enlarged.

Incidentally, in an ordinary reaction, the following ketene transfer is carried out so that the above cut is not carried out:

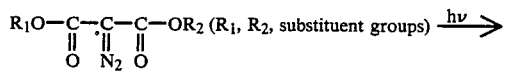 ($R_1$, $R_2$, substituent groups) $\xrightarrow{h\nu}$ $R_1O-\underset{\underset{O}{\|}}{C}-\underset{OR_2}{C}=C=O$ (or, $O=O=\underset{OR_1}{C}-\underset{\underset{O}{\|}}{C}-OR_2$)

However, in case where $R_1$, $R_2$ are extra-large molecules (i.e., resin) as in the present invention, transfer of $R_1$ and $R_2$ is quite difficult due to three-dimensional obstacles and therefore, the cut is carried out.

Still further, the pattern forming material used in the invention has good heat-resisting characteristics due to the performance of the cross-linked resin.

As to the compound including

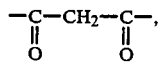

any compound can be used provided that it reacts to form an ester with the polymer to be reacted or it makes some bonding (hydrogen bonding, complex material etc.). Generally, acids, acid-chlorides, esters, amides etc. which contain

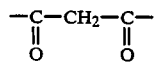

can be used. For example,

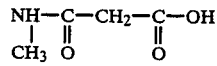

exhibits hydrogen bonding at one end, and ester coupling at the other end to a resin which includes OH-group as shown by:

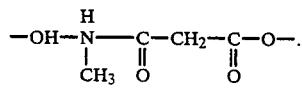

As to the type of the bonding, there is a little difference in bonding energy, but there is no difference in the point that two-dimensionally or three-dimensionally cross-linked resins are synthesized.

Incidentally, the reaction of the polymer and the compound including

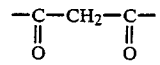

is generally and mainly of the reaction to make an ester with a polymer including an OH-group and the compound of

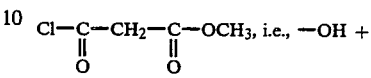, i.e., $-OH +$

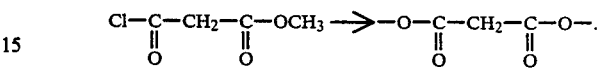

However, it is not necessary that the polymer includes an OH-group. If it exhibits some bonding (hydrogen bonding, complex material etc.) with the compound including

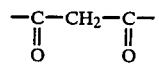

and has the cross-linking by

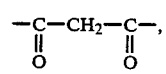, it can be used.

In case where the polymer includes more than two OH groups, it reacts to form a compound including

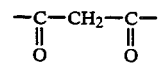

and becomes a three-dimensionally cross-linked resin. Where this is used as the pattern forming method after diazo-formation, one can obtain a pattern forming material in which the difference in molecular weight of the resin before and after the light reaction becomes larger than that in case of two-dimensional cross-linking, resolution is good, and the heat-resistant charasteristics are good because of three-dimensional cross-linking. Even if the polymer is a conjugated material, no problem occurs in the invention.

Further, in case where the resin which has low absorption at around 249 nm includes nitrogen atoms, the heat-resisting characteristics thereof become larger which is advantageous in a pattern forming material.

In a resin including the amide group

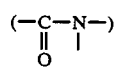

or imide group

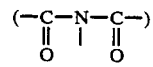

as nitrogen atoms, its thermal transfer temperature is approximately more than 150° C. In the polymer including nitrogen atoms, nitrogen atoms may be located at positions where the atoms react with the compound including

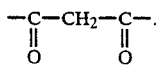

For example, the resin is cross-linked by amide bonding as shown by:

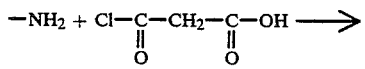

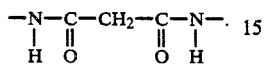

If nitrogen atoms are included in the pattern forming material, heat-resisting characteristic which are the same as above, can be obtained. Therefore, even if nitrogen atoms are included in $R_1$ or $R_2$ of

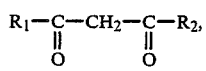

and remain in the final product, the heat-resisting characteristics are improved.

As to processes of making a pattern forming material, since the diazo-making process is carried out after bonding is formed by the compound including

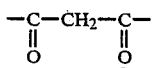

and the polymer, it is advantageous in improving yield. That is, according to this method, yield is increased to approximately 90% from approximately 10% (in the case where bonding is made with the polymer after the compound including

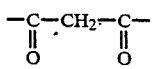

is made into a diazo compound. In other words, according to the method of the invention, there is no problem of decreasing yield.

As the solvent to be used in the pattern forming material according to this invention, the present inventors used diethylene glycol dimethylether and others which are small in absorption in the vicinity of 249 nm so as not to impede, far as possible, the performance of the resist by the absorption of solvent if left over somewhat after application.

Incidentally, the molecular weight of pattern forming method is preferably approximately 5,000~10,000, taking the fineness of the pattern, heat-resisting characteristics and characteristics of pattern forming film etc. into consideration.

The pattern forming material used in the invention is alkaline-soluble in its light-exposed portion and decreases in its molecular weight so that alkaline-solubility is high. Its non-light-exposed portion does not have a portion to be ionized and therefore, does not show alkaline-solubility.

The pattern forming material can provide a pattern of high contrast upon exposure to KrF (249 nm) excimer laser since absorption is small after 249 nm the light exposure and light-exposed portion is clearly differentiated from the non-light-exposed portion.

As stated above, U.S. application Ser. No. 81,698 is a related application. The application discloses the compound including

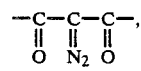

but the pattern forming material in the application is formed by mixing the resin and the compound including

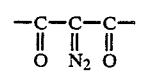

and, differs from the pattern forming material used in the present invention which includes

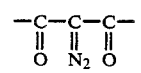

in the resin, and carboxylic acid is produced after the exposure and molecular weight is greatly decreased due to decomposition of resin. Because of the above-stated difference between the invention and the disclosure in Ser. No. 81,698, the present invention is better in sensitivity, contrast of the pattern, and heat-resisting characteristics.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Example 1 m-cresol.novolac resin (molecular weight; approximately 10,000) (100 g) and dimethyl malonic acid (50 g) were reacted by used of acid catalyst so that the following compound (70 g) was obtained.

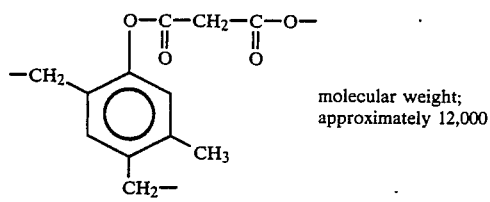

molecular weight; approximately 12,000

The compound was made into a diazo by use of para toluene sulfonyl azide with 50 g in alkali groups. The reaction was as follows.

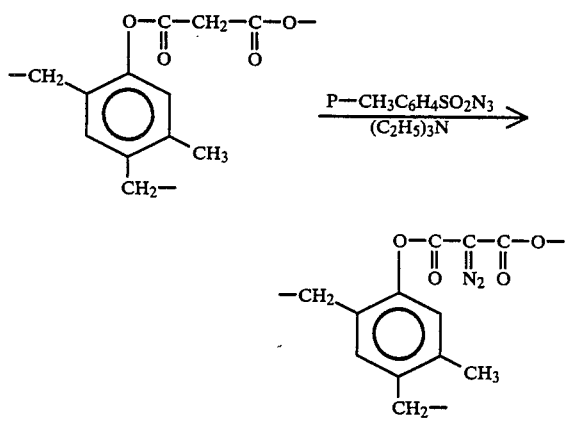

The yield of final diazo compound was as high as 95%, compared with material before diazo formation. The compound (5 g) was dissolved in diethylene glycol dimethyl ether (20 g) to thereby obtain the pattern forming material.

Figure 1A:
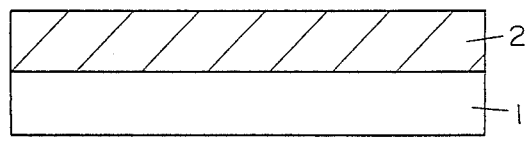
FIGS. 1A to 1C are sectional views to illustrate the steps of one embodiment of the method of the present invention for pattern-formation using a pattern-forming material.
Figure 1B:
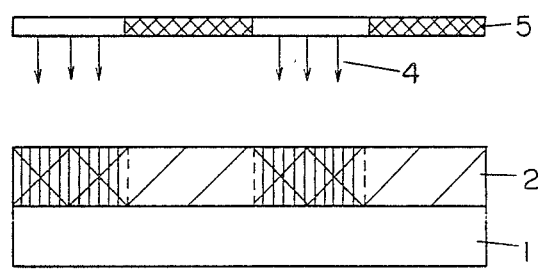
Figure 1C:
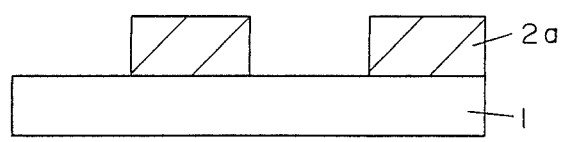

Referring now to FIG. 1, the method of forming a resist pattern by using the pattern forming material of this invention is described below. A pattern forming material of this invention was applied by rotation on a substrate 1, and a resist film 2 of 1.5 μm in thickness was obtained (FIG. 1A). By a KrF excimer laser light 4 of 249 nm, the resist 2 was selectively exposed pulsively by means of a mask 5 (FIG. 1B). Finally, by an ordinary alkaline developing process, a resist pattern 2a was obtained (FIG. 1C). The resist pattern 2a thus obtained was a fine pattern (0.3 μm) of good contrast and high precision exactly according to the mask design. Since this pattern forming material was a novolak resin, the etching resistance was excellent, and the sensitivity was about 50 mJ/cm², i.e., half that of AZ2400.

Figure 2:
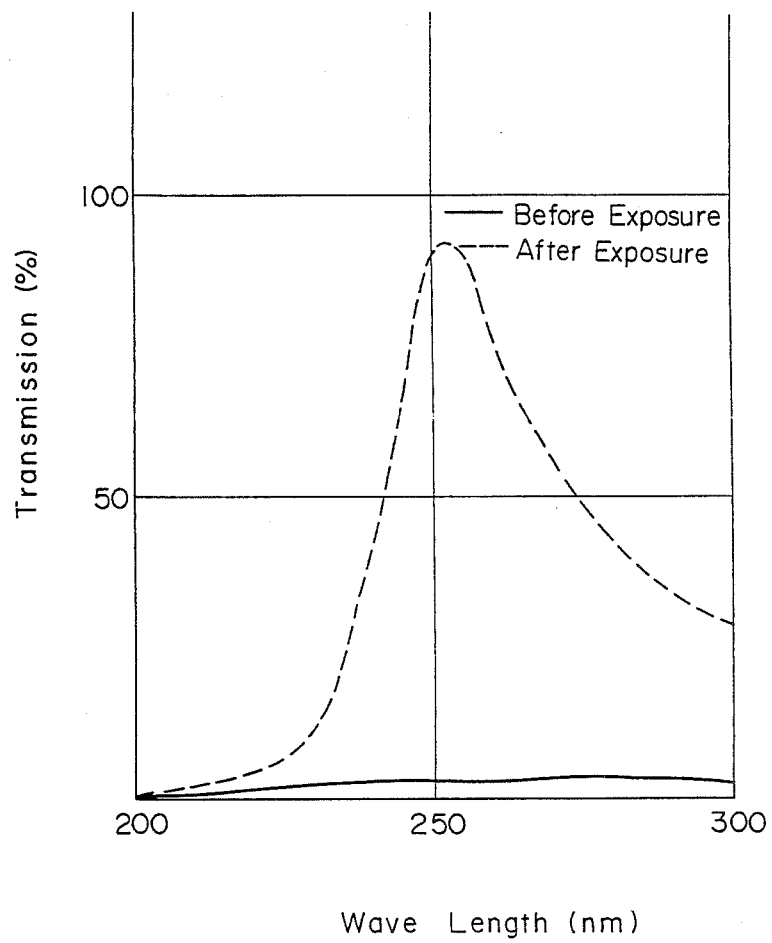
FIG. 2 shows an ultraviolet spectrometric curve of one example of a pattern forming material used in the present invention.

FIG. 2 shows the ultraviolet spectral curve before and after exposure of this pattern forming material, in which the difference in transmission before and after the exposure was great, and it is known that the light reached sufficiently as far as the lower part of the resist to improve the pattern shape.

Example 2

O-chloro-m-cresol, novolac resin (100 g) and 56 g of

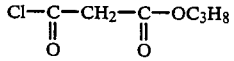

were reacted by use of acid catalyst so that the following compound (62 g) was obtained.

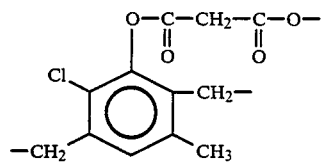

molecular weight; approximately 10,000

The compound was made diazo by use of para toluene sulfonyl azide with 52 g in alkali groups. The reaction is as follows.

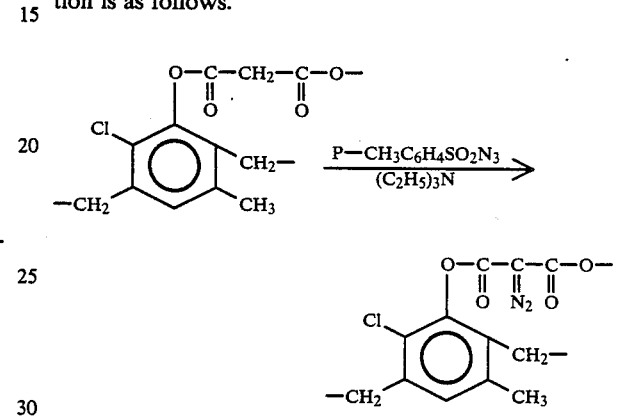

The yield of final, diazo compound was as high as 93% compared with material before diazo-formation. The compound (5 g) was dissolved in 2-ethoxy ethyl alcohol (20 g) to thereby obtain the pattern forming material.

Figure 3:
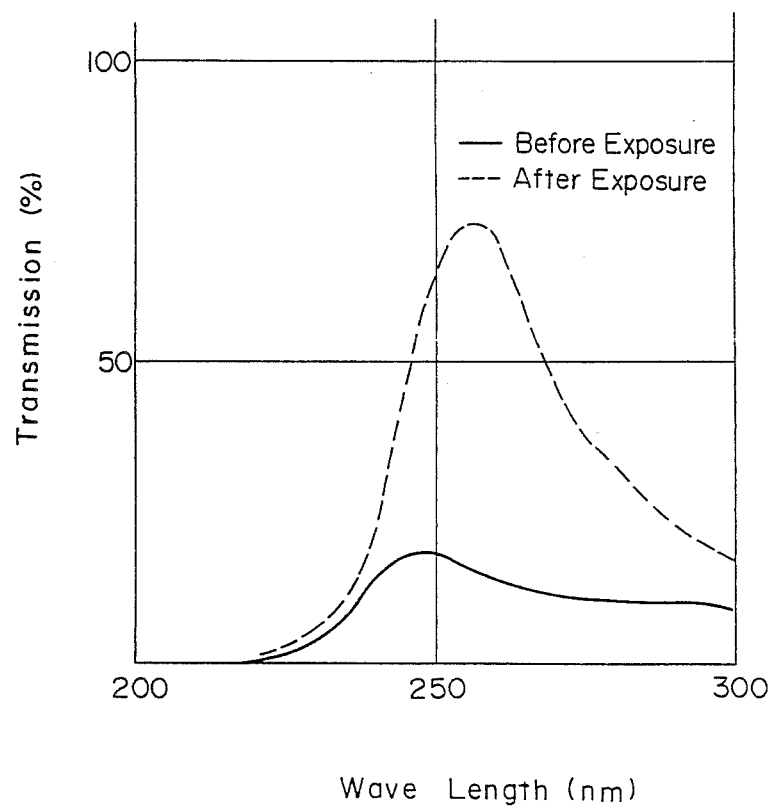
FIGS. 3, 4, 5, 6 and 7 each show an ultraviolet spectrometric curve of a pattern-forming contrast-enhanced material as prepared in the examples of the present invention.

The ultraviolet spectral curve before and after exposure of this pattern forming material is shown in FIG. 3. In the vicinity of 249 nm, the difference in absorption before and after exposure was great, which suggests that a pattern of an excellent shape may be obtained.

The same procedure as in Example 1 was carried out, except that a pattern forming material having composition of the invention was used in place of the pattern forming material as used in Example 1, and as a result, a sharp resist pattern of 0.3 μm was obtained.

Example 3

Resin (100 g) of

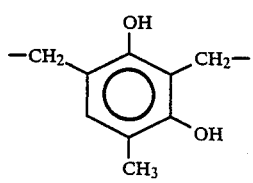

and 50 g of

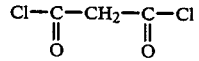

was reacted by use of an acid catalyst so that the following compound (72 g) was obtained.

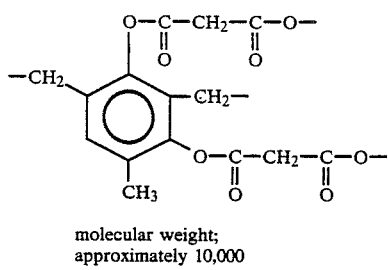

molecular weight; approximately 10,000

The compund was made diazo by use of para toluene sulfonyl azide with 50 g in alkali groups. The reaction was as follows.

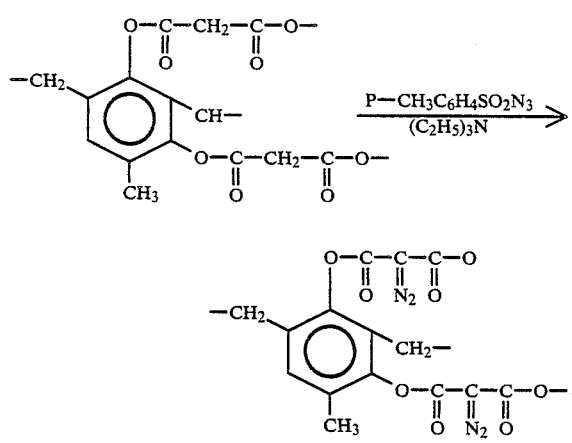

The yield of final, diazo compound is as high as 95%, compared with material before diazo-formation. The compound (4 g) was dissolved in diethylene glycol dimethyl ether (16 g) so that the pattern forming material was obtained.

Figure 4:
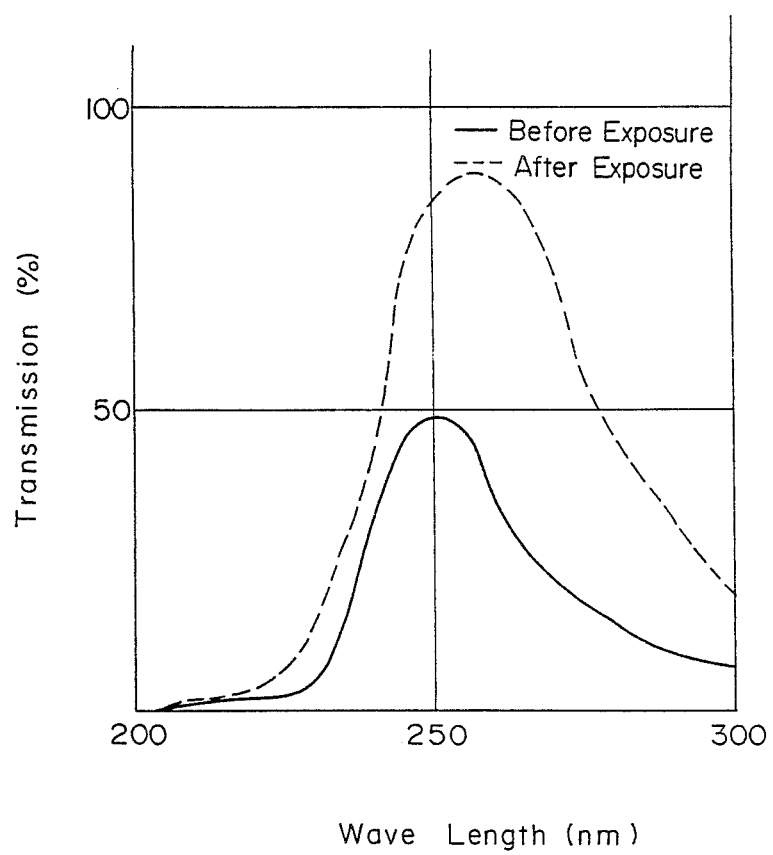

The ultraviolet spectral curve before and after exposure of this pattern forming material is shown in FIG. 4. The difference in absorption was great in the vicinity of 249 nm, and it was known that there was almost no absorption after exposure.

The same procedure as in Example 1 was carried out, except that a pattern forming material having composition of the invention was used in place of the pattern forming material as used in Example 1, and as a result, a sharp resist pattern of 0.3 μm was obtained. The sensitivity was about 52 mJ/cm².

Example 4 m-cresol.novolak resin (molecular weight; approximately 10,000) (100 g) and 50 g of

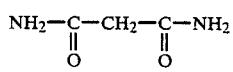

were reacted by use of an acid catalyst so that the following compound (70 g) was obtained.

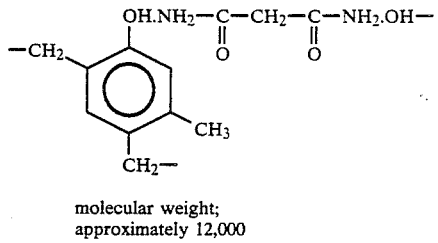

molecular weight; approximately 12,000

The compound was made into a diazo by use of para toluene sulfonyl azide with 50 g in alkali groups. The reaction was as follows.

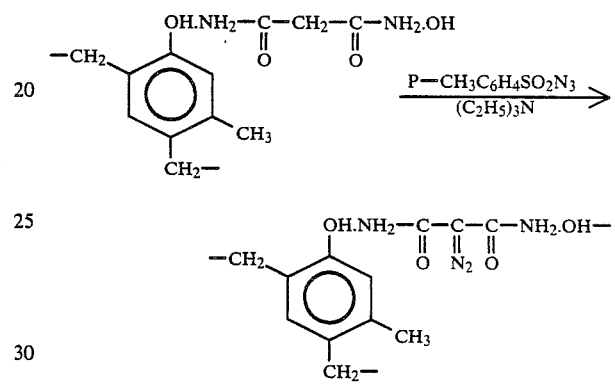

The yield of final, diazo compound was as high as 95%, compared with material before diazo-formation. The compound (4 g) was dissolved in diethylene glycol dimethyl ether (32 g) so that the pattern forming material was obtained.

Figure 5:
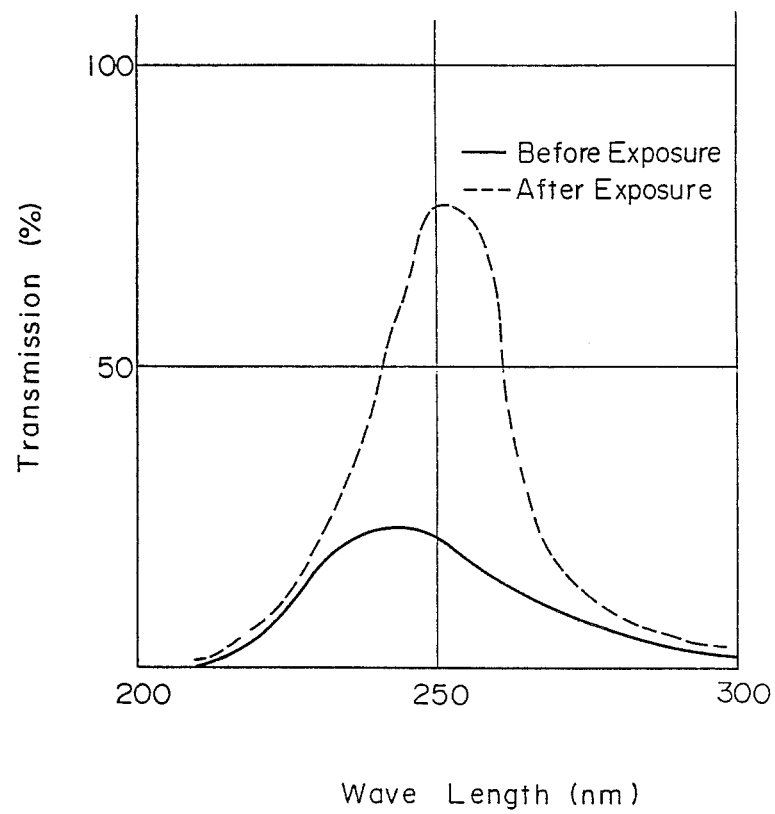

The ultraviolet spectral curve before and after exposure of this pattern forming material is shown in FIG. 5. The difference in absorption near 249 nm is large, which suggests that there is almost no absorption after exposure.

The same procedure as in Example 1 was carried out, except that a pattern forming material having composition of the invention was used in place of the pattern forming material as used in Example 1, and as a result, a sharp resist pattern of 0.3 μm was obtained at a sensitivity of about 50 mJ/cm².

Example 5

Resin (100 g) of

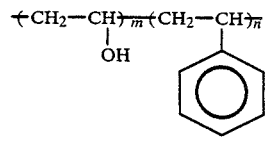

(m, n; arbitrary real number) and 50 g of

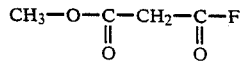

were reacted by use of alkali catalyst so that the following compound (70 g) was obtained.

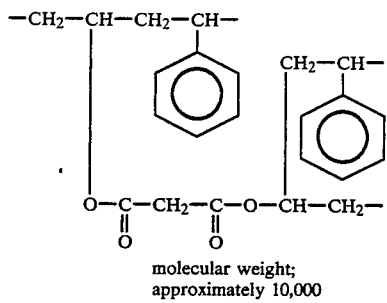

molecular weight; approximately 10,000

The compound was made into a diazo by use of para toluene sulfonyl azide with 48 g in alkali groups so that the following compound was obtained.

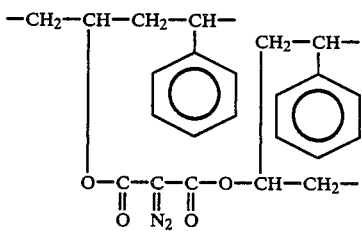

The yield rate of final product, diazo compound was as high as 90%, compared with material before diazo-formation. The compound (4.5 g) was dissolved in diethylene glycol dimethyl ether (21 g) so that the pattern forming material was obtained.

Figure 6:
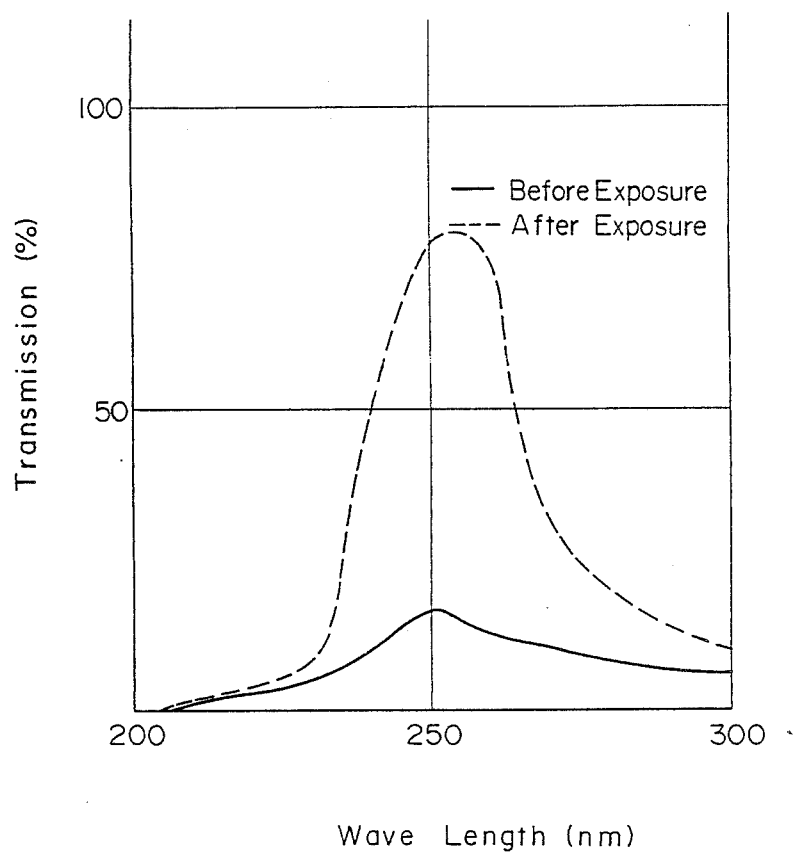

The ultraviolet spectral curve before and after exposure of this pattern forming material is shown in FIG. 6. The absorption difference near 249 nm is great, and it is known that there is almost no absorption after exposure.

The same procedure as in Example 1 was carried out, except that a pattern forming material having composition of the invention was used in place of the pattern forming material as used in Example 1, and as a result, a sharp resist pattern of 0.3 μm was obtained at a sensitivity of about 50 mJ/cm².

Example 6

Resin (100 g) of

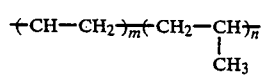

(m, n; real number) and 45 g of

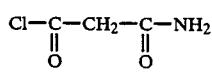

were reacted by use of an alkali catalyst so that the following compound was obtained.

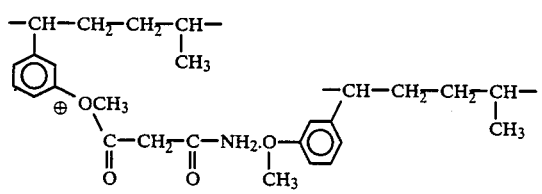

-continued
molecular weight; approximately 11,000

The compund was made into a diazo by use of para-toluene sulfonyl azide with 47 g in alkali groups so that the following compound was obtained.

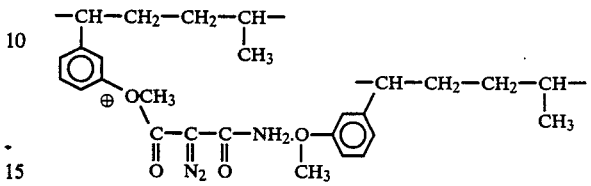

The yield of finally obtained diazo compound was as high as 90%, compared with the material before diazo-formation. The compound (5 g) was dissolved in 2-ethoxy ethyl alcohol (40 g) so that the pattern forming material was obtained.

Figure 7:
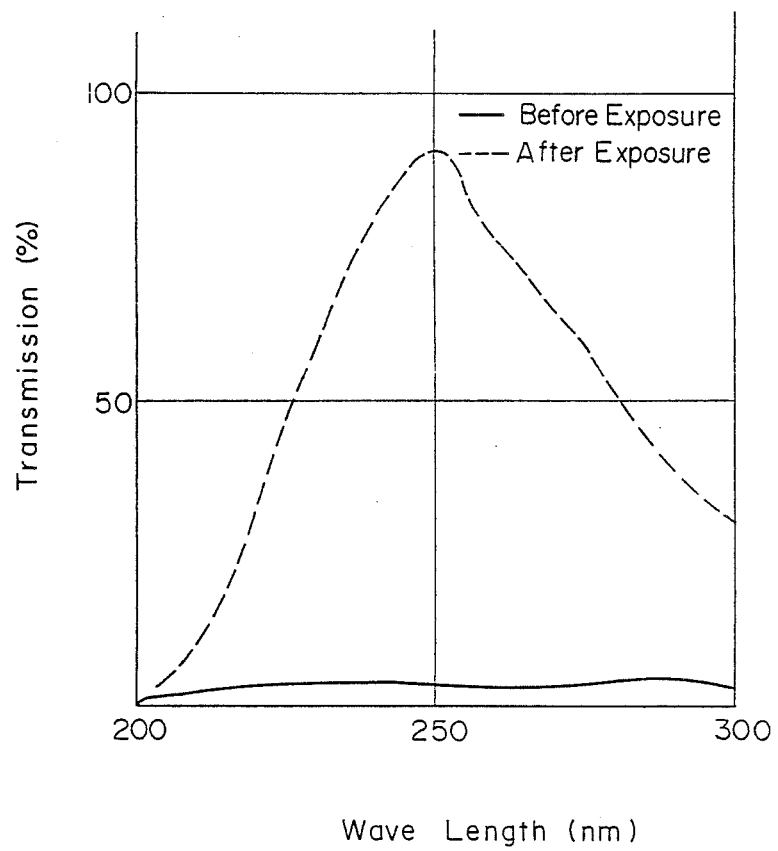
Figure 8:
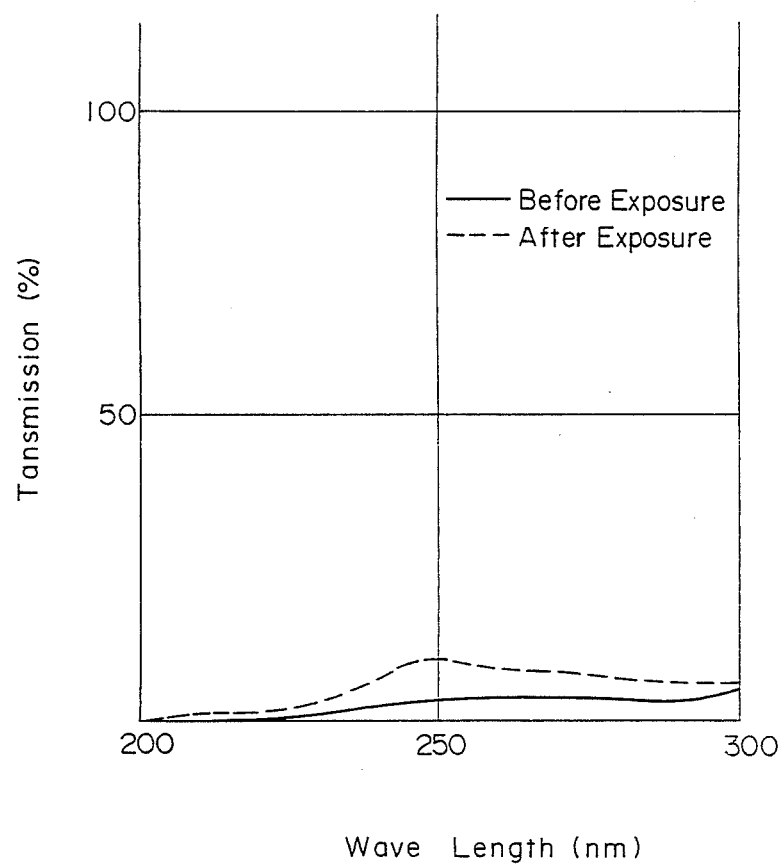
FIG. 8 is an ultraviolet spectral curve in DUV region before and after exposure of a conventional resist (AZ2400)
Figure 9A:
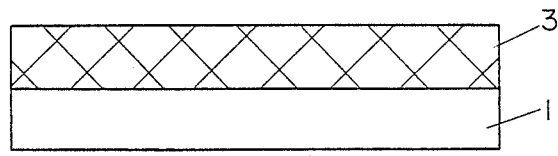
FIG. 9 is a sectional view of a conventional pattern forming process.
Figure 9B:
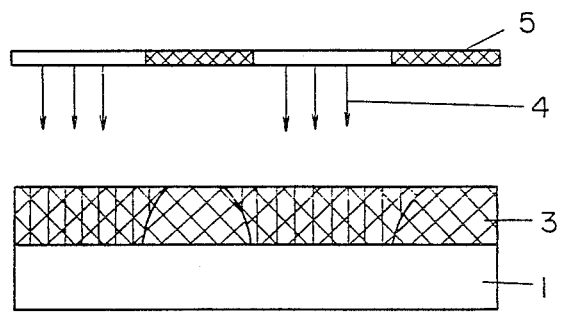
Figure 9C:
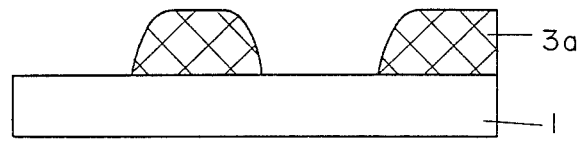

The ultraviolet spectral curve before and after exposure of this pattern forming material is shown in FIG. 7.

The absorption difference near 249 nm is great, and it is known that there is almost no absorption after exposure.

The same procedure as the Example 1 was carried out, except that a pattern-forming material having composition of the invention was used in place of the pattern-forming material as used in the Example 1, and as a result, a sharp resist pattern of 0.3 μm was obtained.

Example 7

Resin (100 g) of

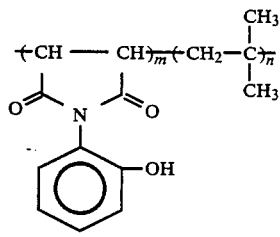

and 50 g of

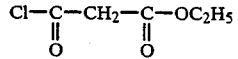

were reacted by use of an acid catalyst so that the following compound (70 g) was obtained.

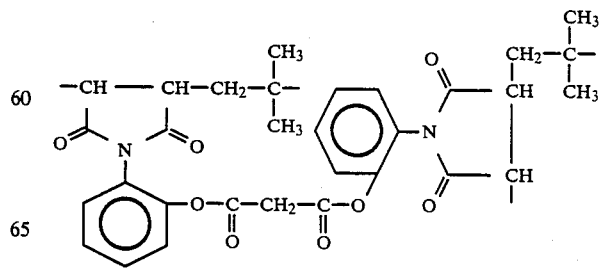

molecular weight; approximately 10,000

The compound was made into a diazo by use of para-toluene sulfonyl azide with 50 g in alkali groups. The reaction was as follows.

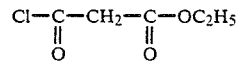

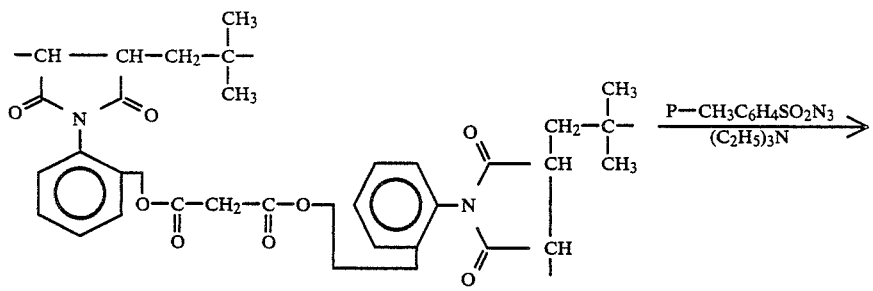

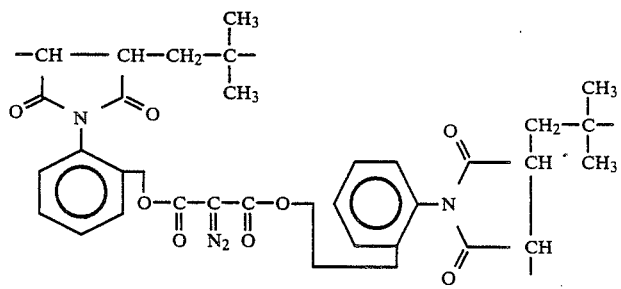

The yield of finally obtained diazo compound was as high as 92%, compared with material before diazo-formation. The compound (4 g) was dissolved in diethylene glycol dimethyl ether (20 g) so that the pattern forming material was obtained.

The same procedure as the Example 1 was carried out, except that a pattern-forming material having composition of the invention was used in place of the pattern-forming material as used in the Example 1, and as a result, and a sharp resist pattern of 0.3 μm was obtained.

Example 8

Resin (100 g) of

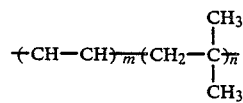

(m, n; integer) and 50 g of were reacted by use of acid catalyst so that the following compound (70 g) was obtained.

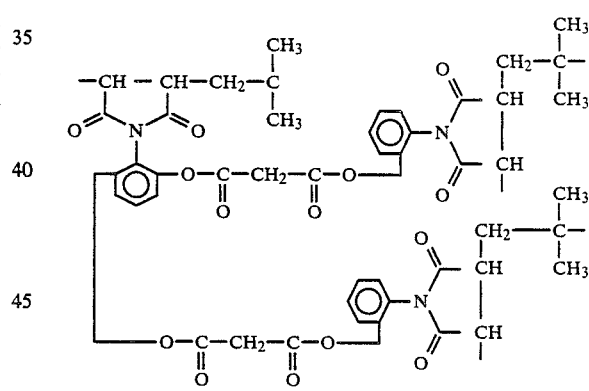

The compound was made diazo by use of para-toluene sulfonyl azide with 50 g in alkali groups. The reaction was as follows.

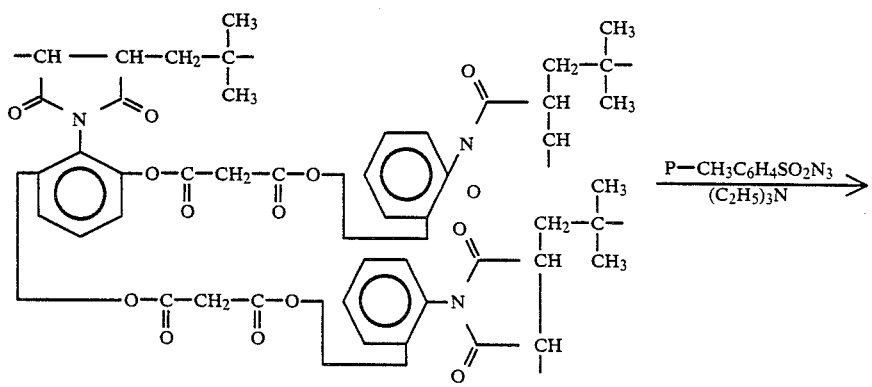

-continued

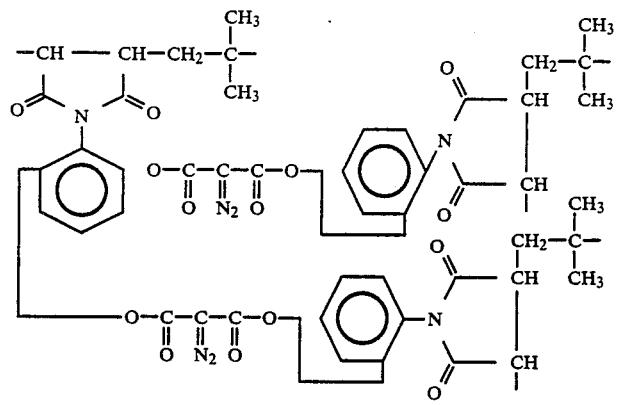

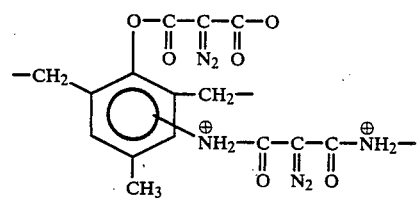

The yield of finally obtained diazo compound is as high as 90%, compared with material before diazo-formation. The compound (3 g) was dissolved in diethylene glycol dimethyl ether (10 g) so that the pattern forming material was obtained.

The same procedure as the Example 1 was carried out, except that a pattern-forming material having composition of the invention was used in place of the pattern-forming material as used in the Example 1, and as a result, a sharp resist pattern of 0.3 μm was obtained.

Example 9

Resin (100 g) of

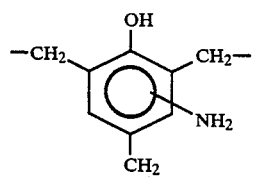

and 50 g of

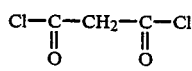

were reacted by use of alkali catalyst so that the following compound (74 g) was obtained.

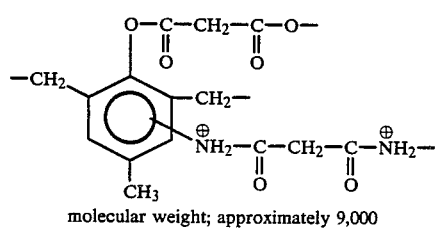

molecular weight; approximately 9,000

The compound was made diazo by use of para-toluene sulfonyl azide with 48 g of alkali groups so that the following compound (resin) was obtained.

The yield of finally obtained diazo compound was as high as 92%, compared with material before diazo-formation. The compound (3 g) was dissolved into diethylene glycol dimethyl ether (11 g) so that the pattern forming material was obtained.

The same procedure as the Example 1 was carried out, except that a pattern-forming material having composition of the invention was used in place of the pattern-forming material as used in the Example 1, and as a result, sharp resist pattern of 0.3 μm was obtained.

Example 10

Resin (100 g) of

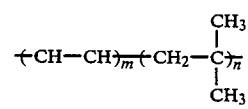

(m, n; integer) and 50 g of

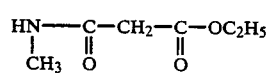

were reacted by use of an acid catalyst so that the following compound (70 g) was obtained.

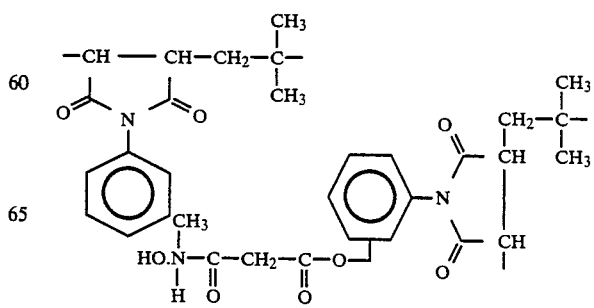

-continued
molecular weight; approximately 10,000

The compound was made diazo by use of para toluene sulfonyl azide with 50 g in alkali. The reaction formula was as follows.

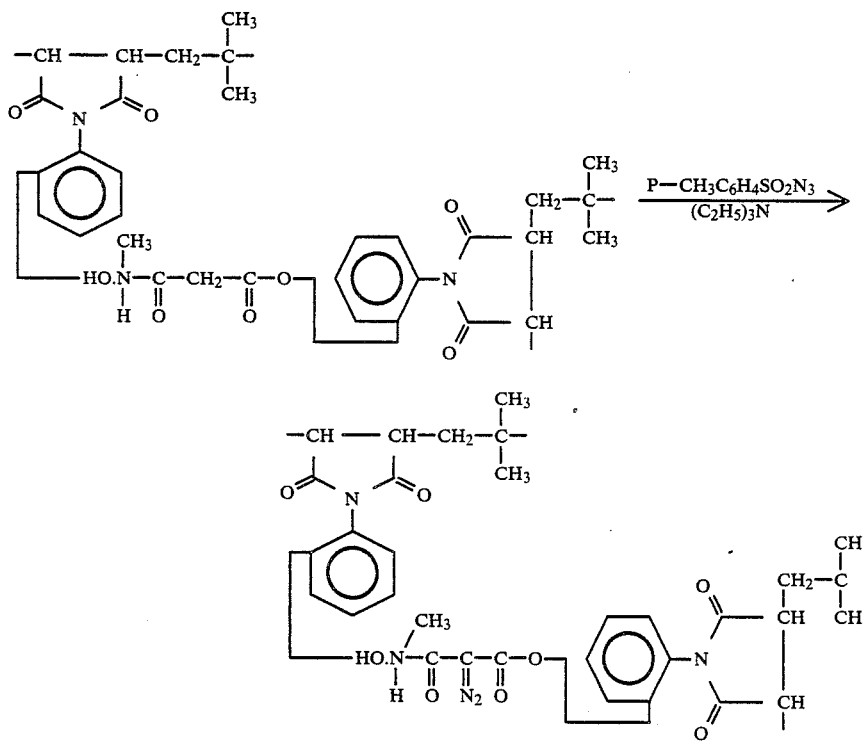

The yield of finally obtained diazo compound was as high as 92%, compared with material before diazo-formation. The pattern forming material was obtained by the compound (3 g) and diethylene glycol dimethyl ether (9 g).

The same procedure as the Example 1 was carried out, except that a pattern-forming material having composition of the invention was used in place of the pattern-forming material as used in the Example 1, and as a result, a sharp resist pattern of 0.4 μm was obtained.

Example 11

The following pattern forming material was prepared.

| polymer whose molecular weight is 7,000 and which has as a repeating unit the following 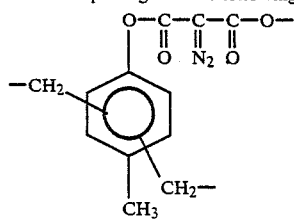 | 30 g |
|---|---|
| diethylene glycol dimethyl ether | 70 g |

The same procedure as in Example 1 was carried out, except that a pattern forming material having composition of the invention was used in place of the pattern forming material as used in Example 1, and as a result, a sharp resist pattern of 0.3 μm was obtained. The sensitivity was about 52 mJ/cm².

Example 12

The same procedure as in Example 1 was carried out, except that a pattern forming material having the following composition was used in place of the pattern forming material as used in Example 1, and as a result, a sharp resist pattern of 0.3 μm was obtained at a sensitivity of about 50 mJ/cm².

| polymer whose molecular weight is 7,000 and which has as a repeating unit the following 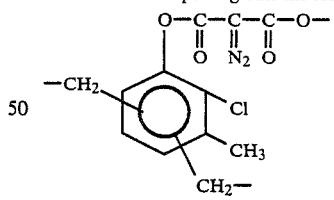 | 30 g |
|---|---|
| diethylene glycol dimethyl ether | 70 g |

The sensitivity of this pattern forming material was about 50 mJ/cm² and was excellent, and this resin was also high in resistance to etching owing to the function of the benzene ring.

Incidentally, even if the position of ester group or other substituent located around benzene ring differs in other materials than in this Example, similar good characteristics can be obtained.

Example 13

The same procedure as the Example 1 was carried out, except that a pattern-forming material having the following composition was used in place of the pattern-forming material as used in the Example 1, and as a result, a sharp resist pattern of 0.3 μm was obtained.

| polymer whose molecular weight is 7,000 and which has as a repeating unit the following 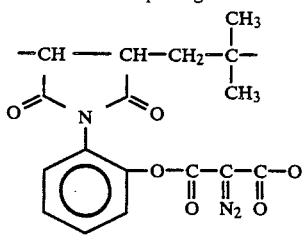 | 30 g |
|---|---|
| diethylene glycol dimethyl ether | 70 g |

The sensitivity of this pattern forming material was about 50 mJ/cm² and was excellent, and this resin was also high in resistance to etching owing to the function of the benzene ring.

Incidentally, even if the position of ester group or other substituent located around benzene ring differs in other materials than in this Example, similar good characteristics can be obtained.

Example 14

The following pattern forming material was prepared.

| polymer whose molecular weight is 7,000 and which has as repeating unit the following 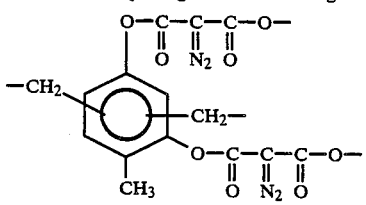 | 30 g |
|---|---|
| diethylene glycol dimethyl ether | 70 g |

The same procedure as in Example 1 was carried out, except that a pattern forming material having composition of the invention was used in place of the pattern forming material as used in Example 1, and as a result, a sharp resist pattern of 0.3 μm was obtained at a sensitivity of about 50 mJ/cm².

Example 15

The same procedure as the Example 1 was carried out, except that a pattern-forming material having the following composition was used in place of the pattern-forming material as used in the Example 1, and as a result, sharp resist pattern of 0.3 μm was obtained.

| polymer whose molecular weight is approximately 7,000 and which has as a repeating unit the following 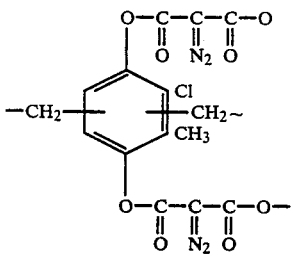 | 30 g |
|---|---|
| diethylene glycol dimethyl ether | 70 g |

The sensitivity of this pattern forming material was about 50 mJ/cm² and was excellent, and this resin was also high in resistance to etching owing to the function of the benzene ring.

Incidentally, even if the position of ester group or other substituent located around benzene ring differs in other materials than in this Example, similar good characteristics can be obtained.

Example 16

The same procedure as the Example 1 was carried out, except that a pattern-forming material having the following composition was used in place of the pattern-forming material as used in the Example 1, and as a result, a sharp resist pattern of 0.4 μm was obtained.

| polymer whose molecular weight is 7,000 and which has as a repeating unit the following 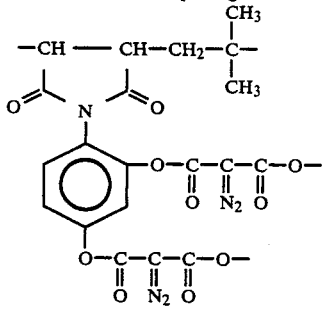 | 30 g |
|---|---|
| diethylene glycol dimethyl ether | 70 g |

The sensitivity of this pattern forming material was about 55 mJ/cm² and was excellent, and this resin was also high in resistance to ethcing owing to the function of the benzene ring.

Incidentally, even if the position of ester group or other substituent located around benzene ring differs in other materials than in this Example, similar good characteristics can be obtained.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A pattern forming method comprising:
   a. applying on a substrate a pattern forming material which is composed of a diazo compound which includes a bonding unit of

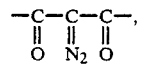, has high absorption of light at or near 249 nm before exposure thereto and low absorption of light at or near 249 nm after exposure thereto and which material is soluble in a solvent which dissolves said resin after said exposure; said compound having a

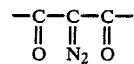

bonding unit being formed by reacting a resin having a

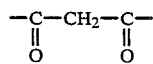

bonding unit, to produce a reaction product and then forming said diazo compound from the reaction product;

b. selectively exposing said pattern forming material to such light at or near 249 nm; and
c. developing said pattern forming material by applying said solvent thereto.

2. The method of claim 1, wherein said light near 249 nm is a pulse light as oscillated from a KrF excimer laser.

3. The method of claim 1, wherein said solvent is small in absorption near 249 nm.

4. The method of claim 1, wherein said solvent is diethylene glycol dimethyl ether.

5. The method of claim 1, wherein said compound which has low absorption near 249 nm is a resin which includes at least one OH group.

6. The method of claim 5, wherein said resin which includes at least one OH group is novolak resin.

7. The method of claim 1, wherein said resin includes at least one nitrogen atom.

8. The method of claim 1, wherien said resin includes imide bonding.

9. The method of claim 1, wherein the diazo-formation is carried out by use of para toluene sulfonyl diazide.

10. The method of claim 1, wherein said resin includes amide bonding.

11. The method of claim 1, wherein said solvent is alkaline.

* * * * *